PIEZOELECTRIC CERAMIC MATERIALS

Filed Dec. 20, 1967 5 Sheets-Sheet 1

Noboru Ichinose
Yoshikazu Tanno
Katsunori Yokoyama
INVENTORS
BY George B. Oujevolk
Attorney BY Noboru Ichinose
Yoshikazu Tanno
Katsunori Yokoyama
INVENTORS
George B. Oujevolk
Attorney Noboru Ichinose
Yoshikazu Tonno
BY Katsunori Yokoyama
INVENTORS George B. Oujevolk
Attorney BY Noboru Ichinose
Yoshihoza Tanno
Katsunori Yokoyama
INVENTORS
George B. Oujevolk
Attorney BY Noboru Ichinose
Yoshikazu Tanno
Katsunori Yokoyama
INVENTORS George B. Oujevolk
Attorney

United States Patent Office 3,468,800

Patented Sept. 23, 1969

3,468,800
PIEZOELECTRIC CERAMIC MATERIALS
Katsunori Yokoyama, Noboru Ichinose, and Yoshikazu Tanno, Yokohama-shi, Japan, assignors to Tokyo Shibaura Electric Co., Ltd., Kawasaki-shi, Japan, a corporation of Japan
Filed Dec. 20, 1967, Ser. No. 692,107
Claims priority, application Japan, June 12, 1967, 42/37,153
Int. Cl. C04b *35/46, 35/48*
U.S. Cl. 252—62.9 2 Claims

ABSTRACT OF THE DISCLOSURE

A piezoelectric ceramic material consisting of 44.0 to 50.0 mol percent of $PbTiO_3$, 0.5 to 6.0 mol percent of a compound represented by the general formula $$Pb(MeNb)_{0.5}O_3$$

where Me being an element selected from the group consisting of In, Y, La, Nd, Sm, Eu, Gd, Tb, Dy, Ho, Er, Tm, Yb and Lu, and the remainder of $PbZrO_3$. The material has a high electromechanical coupling coefficient of more than 40% suitable for various applications such as an electromechanical transducer.

This invention relates to piezoelectric materials having piezo-effect and more particularly to piezoelectric ceramics of the lead-zirconium-titanium series.

One of the known piezoelectric materials consists of a solid solution of lead titanate and lead zirconate which is represented by the following general formula:

$$Pb(Ti_xZr_{(1-x)})O_3 \quad (1)$$

This material, however, has a poor electromechanical coupling coefficient, for example, less than 40%, even when the material consists of the composition shown by the general formula, wherein $x$ is in a range of from 0.45 to 0.50 at which the most favorable piezoelectric characteristics are exhibited due to a morphotropic phase transition.

Materials having compositions represented by the following general Formulae 2 and 3 which are modifications of the above Formula 1

$$Pb(Ti_xZr_{(1-x'-y')}Sn_{y'})O_3 \quad (2)$$

$$Pb(Ti_{(1-a-b)}Zr_aSn_b)O_3 \quad (3)$$

and materials having compositions, wherein a portion of Pb of the compositions represented by the Formulae 1 and 3 are replaced by less than 30 mol percent of Sr, Ba or Ca, are also known in the art. Although these known materials have improved the electromechanical coupling coefficient over the material of the composition represented by Formula 1 when the powdered constituents of these compositions are sintered by powder metallurgy technique to obtain ceramic articles, yet high sintering temperatures are required owing to the low sinterability of the constituents. Moreover, the sintered articles obtained would have relatively large porosity.

It has been proposed to incorporate oxides of trivalent or pentavalent metals such as $Sb_2O_3$ and $Nb_2O_5$ to the composition shown by Formula 1. In sintering, these materials cause the evaporation loss of the most volatile PbO component. Thus changes in the composition have affected its desired piezoelectric characteristics.

This invention provides a piezoelectric ceramic material which consists of from 44.0 to 50.0 mol percent of $PbZrO_3$, from 0.5 to 6.0 mol percent of a compound represented by the general formula:

$$Pb(MeNb)_{0.5}O_3$$

where Me is an element selected from the group consisting of In, Y, La, Nd, Sm, Eu, Gd, Tb, Dy, Ho, Er, Tm, Yb and Lu, and the remainder of $PbZrO_3$. The piezoelectric material can further contain 0.01 to 1.0, by weight, of $MnO_2$ to improve the mechanical quality factor.

The $PbTiO_3$-$Pb(MeNb)_{0.5}O_3$-$PbZrO_3$ series piezoelectric ceramic material according to this invention has an improved electromechanical coupling coefficient K of more than 40% and increased mechanical quality factor Qm.

This invention can be more fully understood from the following detailed description taken in connection with the accompanying drawings, in which.

Figure 1:
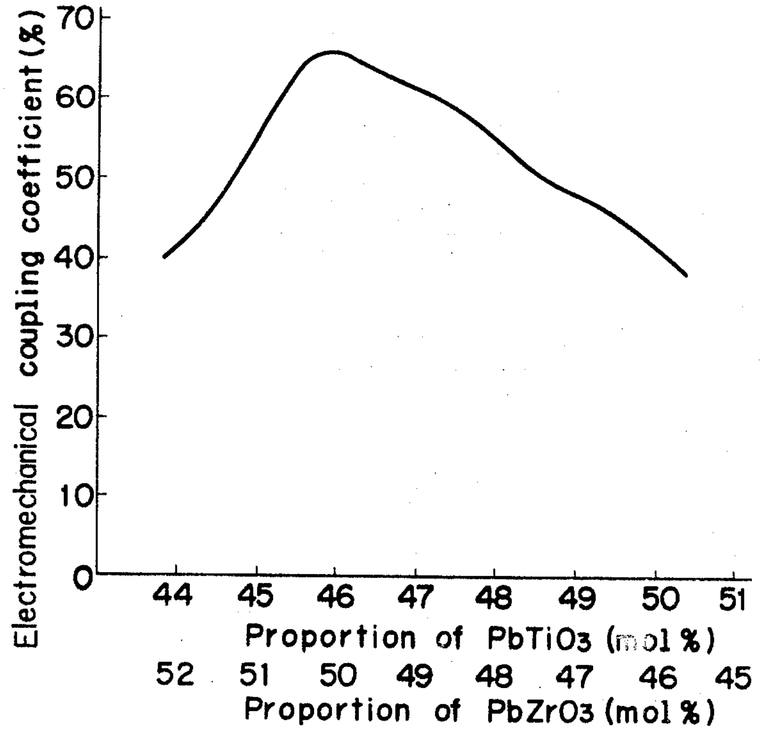
FIG. 1 is a graph showing the relation between the electromechanical coupling coefficient and varying ratios of the $PbTiO_3$ component to the $PbZrO_3$ component involved in the piezoelectric material according to this invention.

In the piezoelectric ceramic material of this invention, proportion of $PbTiO_3$ should be in the range of from 44.0 to 50.0 mol percent to obtain as high a degree of Kr as more than 40%. FIG. 1 shows the Kr values varying with the proportions of $PbTiO_3$ and $PbZrO_3$ in a composition containing 4.0 mol percent of $Pb(YNb)_{0.5}O_3$. In this composition, $PbTiO_3$ of 46.0 mol percent and $PbZrO_3$ of 50.0 mol percent give higher Kr whereas $PbTiO_3$ of less than 44.0 mol percent and in excess of 50.0 mol percent lowers Kr to less than 40%.

Figure 2:
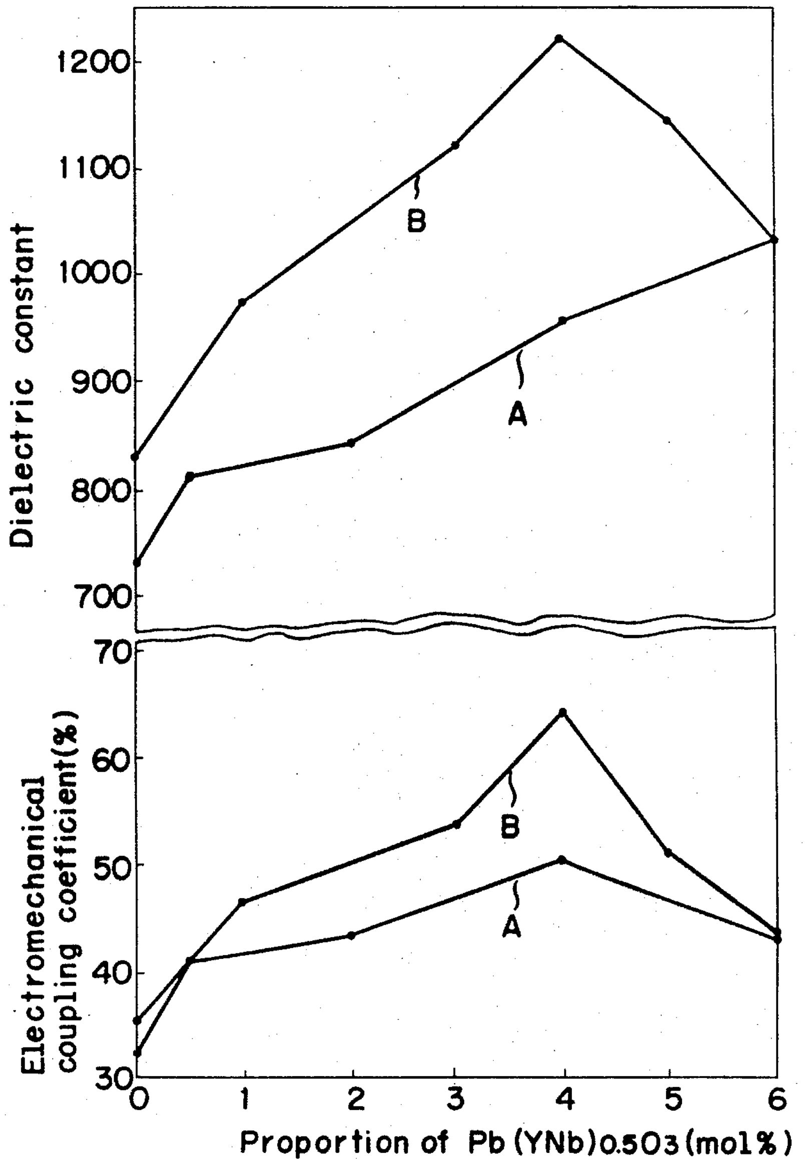
FIG. 2 shows a graph representing the relations between varying ratios of $Pb(YNb)_{0.5}O_3$ and the electromechanical coupling coefficient as well as the dielectric constant of the two material of this invention.

Similarly, in order that the piezoelectric material may have desirable Kr of more than 40% and a higher dielectric constant, the proportion of $Pb(MeNb)_{0.5}O_3$ should be in the range of from 0.5 to 6.0 mol percent. FIG. 2 shows the relations of the proportions of $Pb(YNb)_{0.5}O_3$ to Kr. In this figure, curve A shows the result of measuring Kr values of materials consisting of 45.0 mol percent of $PbTiO_3$, various amount of $Pb(YNb)_{0.5}O_3$ and the remainder of $PbZrO_3$, and curve B shows the result of measurements on similar compositions containing 47.0 mol percent of $PbTiO_3$. As can be noted from these curves, materials containing from 0.5 to 6.0 mol percent of $Pb(YNb)_{0.5}O_3$ exhibit a value of Kr exceeding 40%, as well as a high dielectric constant.

In compounds represented by the general formula:

$$Pb(MeNb)_{0.5}O_3$$

where Me represents an element selected from the group consisting of In, Y, La, Nd, Sm, Eu, Gd, Td, Dy, Ho, Er, Tm, Yb and Lu, belonging to group III of the periodic table, the incorporation of any of these elements and incorporated into the compound according to said general formula has greatly improved Kr.

Figure 3:
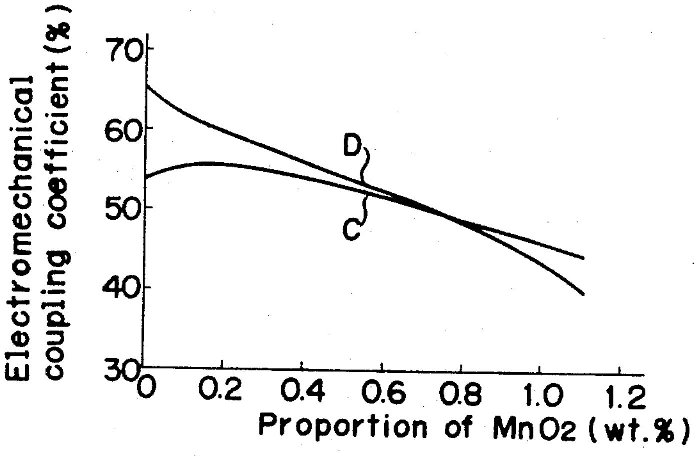
FIG. 3 is a graph showing the relation between the mechanical quality factor and the varying amount of $MnO_2$ for two types of the material.
Figure 4:
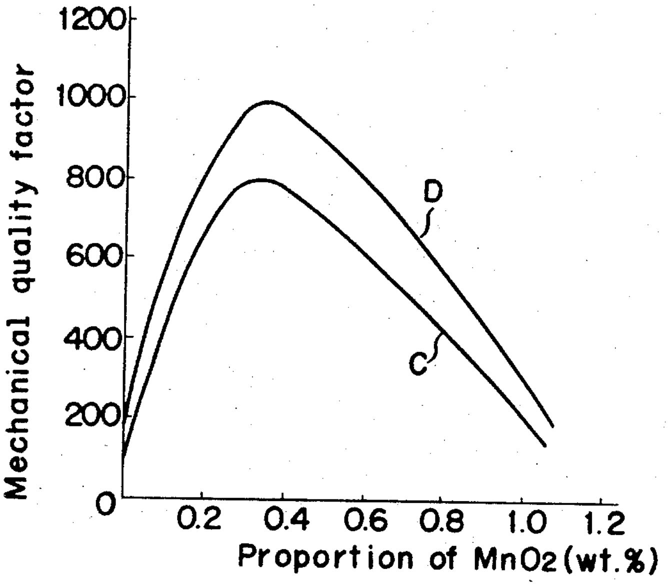
FIG. 4 shows a graph to represent the relation between the electromechanical coupling coefficient and the amount of $MnO_2$ for two types of the material.
Figure 5:
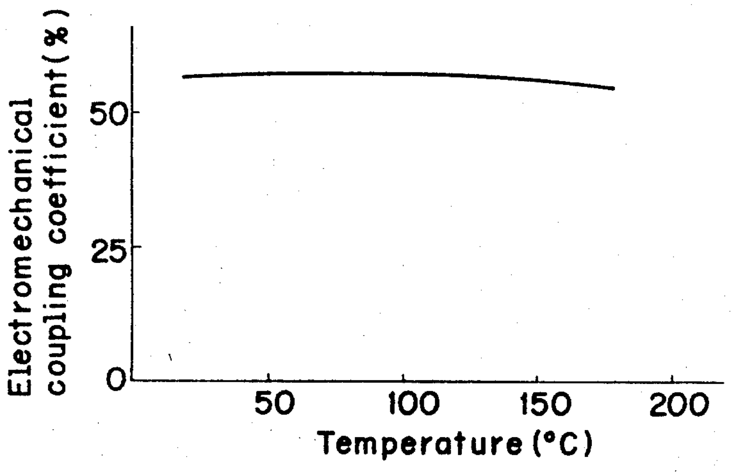
FIG. 5 is a graph illustrating changes in electromechanical coupling coefficient of the material of this invention to the temperatures.
Figure 6:
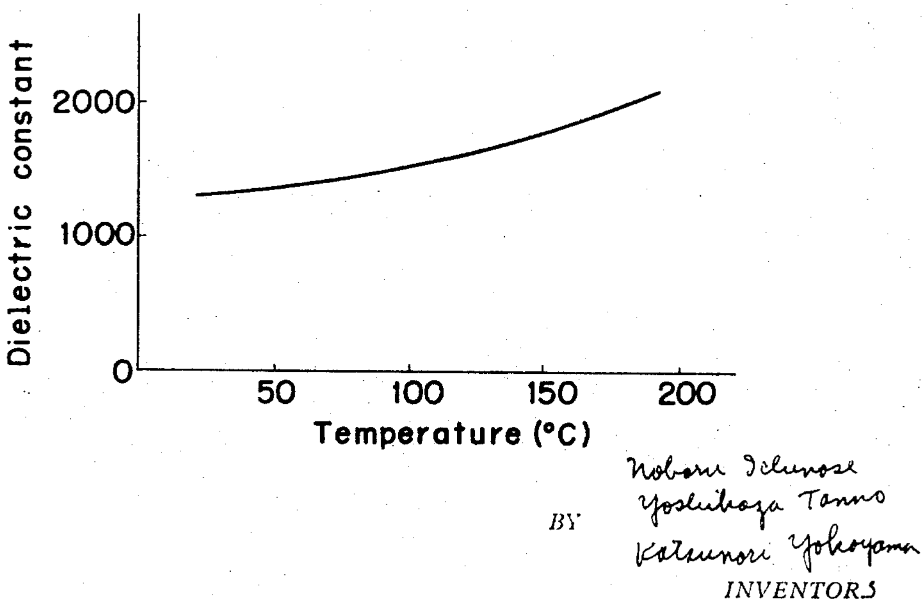
FIG. 6 is a graph to represent changes in the dielectric constant to the temperatures.
Figure 7:
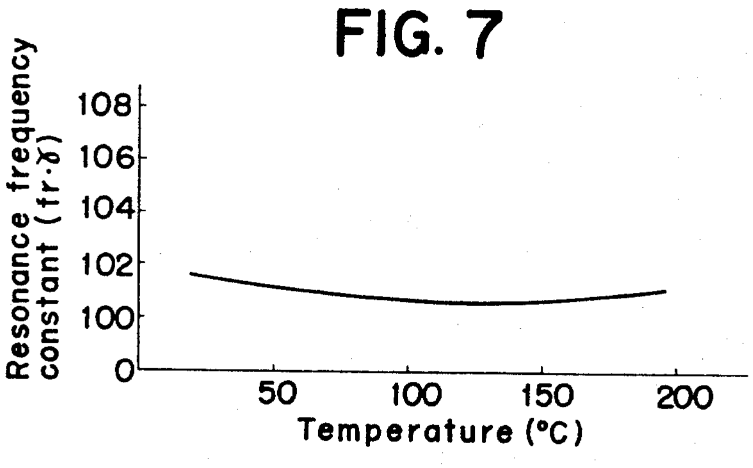
FIG. 7 shows a curve representing changes in the resonance frequency constant.
Figure 8:
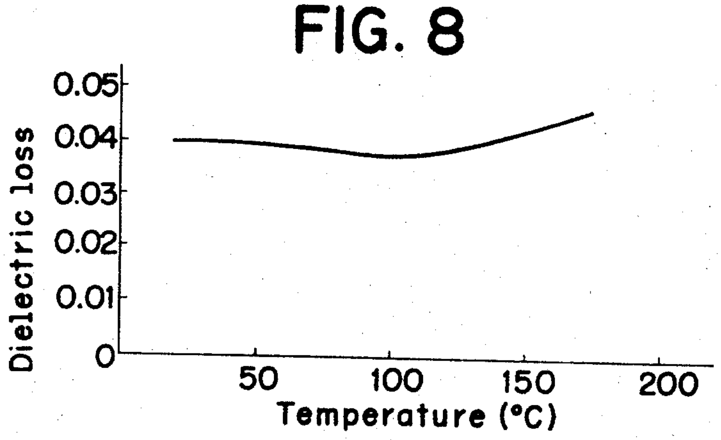
FIG. 8 is a graph illustrating changes in the dielectric loss to the temperatures.
Figure 9:
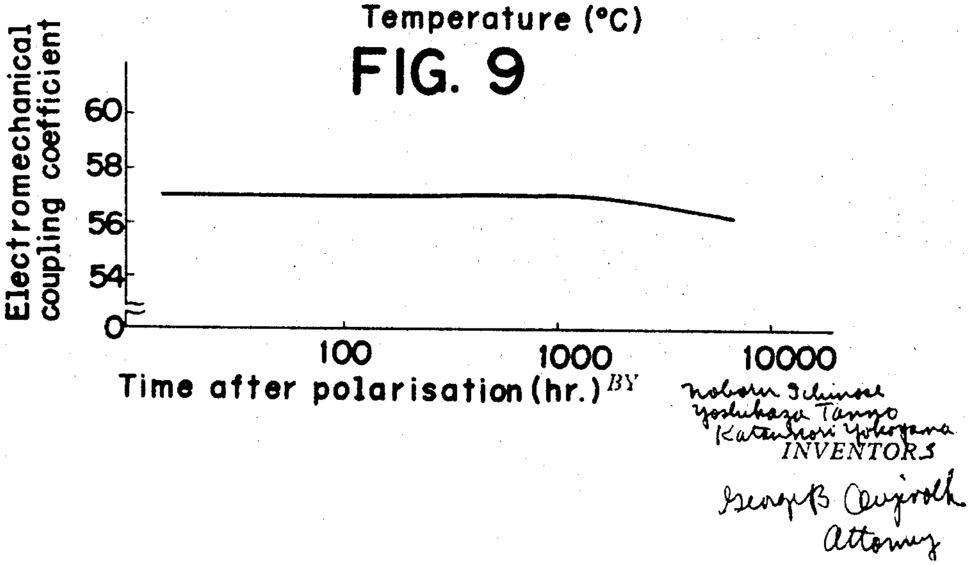
FIG. 9 shows a curve illustrating changes in the electromechanical coupling coefficient to the time after polarization.

The piezoelectric material according to this invention can include from 0.01 to 1.0%, by weight, of $MnO_2$ based on the total quantity of the material. Materials containing $MnO_2$ within this range provide an excellent mechanical quality factor Qm. Curves C and D of FIGS. 3 and 4 show the relation between Qm as well as Kr and the varying proportion of $MnO_2$ contained in the two materials of this invention. Curve C shows the result of measurement made on a material which had a basic composition of 48.0 mol percent of $PbTiO_3$, 4.0 mol percent of $Pb(YNb)_{0.5}O_3$, and the remainder of $PbZrO_3$, into which varying proportions of $MnO_2$ were incorporated and curve D shows those of materials consisting of 46.0 mol percent of $PbTiO_3$, 4.0 mol percent of $Pb(YNb)_{0.5}O_3$, the rest of $PbZrO_3$, to which were added varying proportions of $MnO_2$. While there is a slight difference dependent upon variations in composition, where the proportion of $MnO_2$ exceeds 1.0%, by weight, based on the total quantity of the basic composition, Qm and Kr of the material will be reduced than when the material does not contain $MnO_2$.

The piezoelectric ceramic materials according to this invention can be manufactured by powder metallurgy techniques like conventional materials of the same type. According to the most common method, a particulate raw material having an average particle size of about 0.5 to 1 micron is molded into the desired configuration, and then sintered at a temperature ranging from 1200 to 1300° C., for example. In order to facilitate molding, the raw material may contain a resinous binder such as an aqueous solution of polyvinyl alcohol. The resinous binder will be decomposed and vaporises off from the raw material during sintering.

The raw material may be a mixture, provided it contains sufficient proportions of compounds to produce the above described oxides upon sintering. Generally such compounds are oxides, hydroxides, carbonates or oxalates. Preferably, prior to sintering, these compounds are burned at a temperature ranging from 600 to 900° C. and then pulverized.

The raw material may be sintered in a sealed furnace, in order to prevent the proportion of the materials from being varied due to vaporization.

It has been found that, as compared with materials of the conventional composition prepared from the raw particulate material having the same particle size and sintered at the same temperature, the sintered material of this invention has a considerably larger bulk density. When the raw material having an average particle size of 0.5 to 1 micron is used, the product sintered at a temperature ranging from 1250 to 1300° C. will have a bulk density of 7.5 g./cm.$^3$ or more. This should be compared with materials of the conventional composition having a bulk density of less than 7.0 g./cm.$^3$ even when sintered at temperature up to 1300° C. Such an excellent sinterability enables lower temperatures to be applied thereby to prevent the most volatile PbO component from being lost.

Further with respect to the piezoelectric characteristic, the materials of this invention are extremely stable regardless of temperature changes below 200° C. or lapse of any length of time after polarization, thereby considerably contributing to improve the reliability of the material.

The following specific examples are given by way of illustration and are not to be construed as limiting in any way the specific scope and spirit of the invention. In the examples, the bulk density is given in values at 26° C. whereas the dielectric constant and dielectric loss are expressed in values measured by an alternating current having a frequency of 1 kc./sec.

Example 1

222.6 g. of PbO, 37.1 g. of $TiO_2$, 61.7 g. of $ZrO_2$, 2.7 g. of $Nb_2O_3$ and 2.2 g. of $Y_2O_5$ were mixed together and pulverized in a ball mill burned at a temperature of about 800° C. for one hour and again pulverized in another ball mill. The average particle size of the raw material was about one micron. The powder was then mixed with a small amount of an aqueous solution of polyvinyl alcohol, and the mixture molded into a circular disc having a diameter of 13 mm. and a thickness of 1 mm. by pressing at a pressure of 1000 kg./cm.$^2$. The disc was sintered at a temperature of about 1250° C. for one hour.

The disc thus sintered had a bulk density D of 7.55 g./cm.$^3$ and was composed of 46.0 mol percent of $PbTiO_3$, 4.0 mol percent of $Pb(YNb)_{0.5}O_3$ and the remainder of $PbZrO_3$. A pair of electrodes were attached to the disc to measure its electric characteristics, which showed a Curie temperature Tc of 370° C., a specific resistance ($\rho$) of $10^{11}$ ohm-cm., a dielectric constant ($\epsilon$) of 1210 and a dielectric loss (tan $\delta$) of 0.60%.

The disc was then polarized at 140° C. by applying a DC voltage of 4 kilovolts across it for one hour. After it was allowed to stand in the air for one week, its piezoelectric characteristics were measured and there were obtained the following result:

Kr: 64.1% (at 27° C.)
Qm: 75.

Example 2

As in Example 1, 223.6 g. of PbO 36.4 g. of $TiO_2$, 64.0 g. of $ZrO_2$, 2–12 g. of $Nb_2O_5$ and 1.82 g. of $Y_2O_3$ were burned and pulverized. The particulate raw material was compressed at a pressure of 1000 kg./cm.$^2$ to obtain a circular disc 13 mm. in diameter and 1 mm. thick, and the disc was sintered at a temperature of 1240° C. for 90 minutes. The sintered disc had a composition of 45.1 mol percent of $PbTiO_3$, 3.2 mol percent of $Pb(YNb)_{0.5}O_3$ and the remainder of $PbZrO_3$. Its bulk density D was 7.60 g./cm.$^3$ and its Curie temperature Tc was 365° C.

The electric characteristics were as follows:

$\epsilon$:1300
tan $\delta$:1.8%
$\rho$:$10^{11}$ohm-cm.

The disc was then polarized by applying a DC voltage of 4 kilovolts across it for one hour. After standing it was allowed to stand in the air for 3 days, its piezoelectric characteristics were measured and there were obtained the following result:

Kr:56.5% (at 28° C.)
Qm.:103

The electric characteristics of the material obtained are shown in FIGS. 5 to 9. As clearly shown in these graphs the piezoelectric material had stable electric characteristics in various temperatures and elapse of time after polarization.

Example 3

As in Example 1, 222.6 g. of PbO, 38.6 g. of $TiO_2$, 60.0 g. of $ZrO_2$, 1.86 g. of $Nb_2O_5$ and 2.76 g. of $Yb_2O_3$ were sintered at a temperature of 1220° C. for two hours. The piezoelectric disc thus obtained had a composition of 48.4 mol percent of $PbTiO_3$, 2.8 mol percent of $Pb(YbNb)_{0.5}O_3$ and the remainder of $PbZrO_3$. Its bulk density D was 7.48 g./cm.$^3$ and Curie temperature Tc was 360° C.

Physical characteristics were as follows:

$\epsilon$:1150
tan $\delta$:2.5%
$\rho$:$10^{12}$ohm-cm.
Kr:53.8%
Qm:90.

Example 4

A raw material consisting of 223.1 g. of PbO, 36.5 g. of $TiO_2$, 61.8 g. of $ZrO_2$, 2.66 g. of $Nb_2O_5$ and 2.79 g. of $In_2O_3$ was molded into a circular disc having a diameter of 13 mm. and a thickness of 1 mm. after burning and pulverizing. The disc was sintered at a temperature of 1260° C. for one hour to obtain a composition consisting of 46.0 mol percent of $PbTiO_3$, 4.0 mol percent of $Pb(InNb)_{0.5}O_3$ and the remainder of $PbZrO_3$.

Physical characteristics of the disc were:

D:7.63 g./cm.$^3$
Tc:355° C.
$\epsilon$:1040
tan $\delta$:3.0%
$\rho$:$10^{11}$ohm-cm.
Kr:50.5%
Qm:130.

Example 5

From the same kind of raw material as was used in Example 4 except that the ingredient of $In_2O_3$ was replaced by 3.38 g. of $Nd_2O_3$, there was obtained a piezoelectric disc having a composition of 46.0 mol percent of $PbTiO_3$, 4.0 mol percent of $Pb(NdNb)_{0.5}O_3$ and the remainder of $PbZrO_3$.

Example 6

The piezoelectric material containing 4.0 mol percent of $Pb(GdNb)_{0.5}O_3$ was prepared from the same raw mixture as in Example 4 except that $In_2O_3$ was replaced by 3.64 of $Gd_2O_3$.

Example 7

From the same raw material as in Example 4 except that $In_2O_3$ was replaced by 3.49 g. of $Sm_2O_3$, there was obtained a similar disc containing 4.0 mol percent of $Pb(SmNb)_{0.5}O_3$.

Example 8

The same raw mixture as in Example 4 except that $In_2O_3$ was replaced by 3.73 g. of $Dy_2O_3$ was used to obtain a piezoelectric disc containing 4.0 and mol percent of $Pb(DyNb)_{0.5}O_3$.

Example 9

There was obtained a circular disc containing 4.0 mol percent of $Pb(HoNb)_{0.5}O_3$ from the same raw material as in Example 4 except that $In_2O_3$ was substituted by 3.78 g. of $Ho_2O_3$.

Example 10

From the same raw particulate material as in Example 4 except that the $In_2O_3$ was substituted by 3.87 g. of $Tm_2O_3$, there was prepared a similar disc containing 4.0 mol percent of $Pb(TmNb)_{0.5}O_3$.

Example 11

The same raw mixture as in Example 4 except that $In_2O_3$ was replaced by 3.83 g. of $Er_2O_3$ was used, there was prepared a similar disc containing 4.0 mol percent of $Pb(ErNb)_{0.5}O_3$.

Example 12

From the same raw mixture as in Example 4 except that $In_2O_3$ was substituted by 3.26 g. of $La_2O_3$, there was obtained a similar disc containing 4.0 mol percent of $Pb(LaNb)_{0.5}O_3$.

Example 13

Again the same raw mixture as in Example 4 except that $In_2O_3$ was replaced by 3.52 g. of $Eu_2O_3$ was used to obtain a similar disc containing 4.0 mol percent of $Pb(EuNb)_{0.5}O_3$.

The physical characteristics of the piezoelectric discs obtained from Example 4 through 13 are as follows:

| | D(g./cm.$^3$) | $\epsilon$ | Kr, percent | $Q_m$ |
|---|---|---|---|---|
| Example: | | | | |
| 4 | 7.65 | 1,300 | 65.1 | 105 |
| 5 | 7.55 | 1,270 | 63.6 | 106 |
| 6 | 7.61 | 1,315 | 62.7 | 115 |
| 7 | 7.59 | 1,190 | 64.3 | 103 |
| 8 | 7.63 | 1,245 | 63.8 | 95 |
| 9 | 7.57 | 1,290 | 64.6 | 98 |
| 10 | 7.60 | 1,305 | 61.8 | 138 |
| 11 | 7.51 | 1,210 | 62.1 | 126 |
| 12 | 7.59 | 1,270 | 63.2 | 114 |
| 13 | 7.61 | 1,305 | 62.9 | 108 |

Example 14

A raw mixture consisting of 223.1 g. of PbO, 37.1 g. of $TiO_2$, 51.6 g. of $ZrO_2$, 2.32 g. of $Nb_2O_5$, 1.97 g. of $Y_2O_3$ and 0.652 g. of $MnO_2$ was prepared. The raw mixture was molded into a circular disc having a diameter of 13 mm. and a thickness of 1 mm. after burning and pulverizing under the same conditions described in Example 1. The disc obtained was then sintered at a temperature of 1240° C. for one hour.

The sintered disc comprised a basic composition of 46.5 mol percent of $PbTiO_3$, 3.5 mol percent of $Pb(Ynb)_{0.5}O_3$ and the remainder of $PbZrO_2$, and additionally 0.2%, by weight, of additional component of $MnO_2$ based on the basic composition.

The piezoelectric disc has the following physical characteristics:

D:7.56 g./cm.$^3$
Tc:350° C.
$\epsilon$:1250
tan $\delta$: 0.8%
$\rho$:$10^{10}$ ohm-cm.
Kr:62.1%
Qm:650.

Example 15

As in Example 14. from a mixture of 223.3 g. of PbO, 36.2 g. of $TiO_2$, 62.8 g. of $ZrO_2$, 1.86 g. of $Nb_2O_5$, 1.58 g. of $Y_2O_3$ ond 1.31 g. of $MnO_2$, there was obtained a similar disc which had a basic composition of 45.5 mol percent of $PbTiO_3$, 2.8 mol percent of $Pb(YNb)_{0.5}O_3$ and the remainder of $PbZrO_3$, and additionally 0.4%, by weight, of $MnO_2$ based on the basic composition.

The physical characteristics of the disc were as follows:

D:7.60 g./cm.$^3$
Tc:355° C.
$\epsilon$:1350
tan $\delta$:2.1%
$\rho$:$10^{10}$ ohm-cm.
Kr:55:2%
Qm:750.

Example 16

As in Example 14, a raw mixture consisting of 223.3 g. of PbO, 35.6 g. of $TiO_2$, 61.7 g. of $ZrO_2$, 3.76 g. of $Nb_2O_5$, 3.17 g. of $In_2O_3$ and 2.62 g. of $MnO_2$ was used, there was obtained a circular disc which had a basic composition of 44.5 mol percent of $PbTiO_3$, 5.6 mol percent of $Pb(InNb)_{0.5}O_3$ and the remainder of $PbZrO_3$, and additionally 0.8%, by weight, of $MnO_2$.

The physical characteristics of the disc were:

D:7.62 g./cm.$^3$
Tc:330° C.
$\epsilon$:1350
tan $\delta$:3.2%
$\rho$:$10^9$ ohm-cm.
Kr:49.3%
Qm:263.

While the invention has been described in connection with some preferred embodiments thereof, the invention is not limited thereto and includes any modifications and alternations which fall within the true spirit and scope of the invention as defined in the appended claims.

What is claimed is:

1. A piezoelectric ceramic selected from the group consisting of materials consisting of from 44.0 to 50.0 mol percent of $PbTiO_3$, from 0.5 to 6.0 mol percent of a compound represented by the general formula:

$$Pb(MdNb)_{0.5}O_3$$

where Me is an element selected from the group consisting of In, Y, La, Nd, Nd, Sm, Eu, Gd, Tb, Dy, Ho, Er, Tm, Yb and Lu, and the remainder of $PbZrO_3$ and such materials containing from 0.01 to 1.0%, by weight, of $MnO_2$.

2. The piezoelectric ceramic materials according to claim 1 which contains from 0.01 to 1.0%, by weight, of $MnO_2$.

References Cited

UNITED STATES PATENTS

| | | | |
|---|---|---|---|
| 3,068,177 | 12/1962 | Sugden | 252—62.9 |
| 3,268,453 | 8/1966 | Ouchi et al. | 252—62.9 |
| 3,268,783 | 8/1966 | Saburi | 106—39 X |
| 3,372,121 | 3/1968 | Banno | 252—62.9 |

TOBIAS E. LEVOW, Primary Examiner

J. COOPER, Assistant Examiner

U.S. Cl. X.R.

106—39